United States Patent
Harada

(10) Patent No.: US 10,011,435 B2
(45) Date of Patent: Jul. 3, 2018

(54) CONVEYANCE APPARATUS

(71) Applicant: MURATA MANUFACTURING CO., LTD., Kyoto-fu (JP)

(72) Inventor: Masatoshi Harada, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 2 days.

(21) Appl. No.: 15/366,307

(22) Filed: Dec. 1, 2016

(65) Prior Publication Data

US 2017/0081132 A1   Mar. 23, 2017

Related U.S. Application Data

(63) Continuation of application No. PCT/JP2015/065692, filed on May 29, 2015.

(30) Foreign Application Priority Data

Jun. 4, 2014   (JP) .................................. 2014-115490

(51) Int. Cl.
| | | |
|---|---|---|
| *B65G 47/14* | (2006.01) | |
| *B65G 47/24* | (2006.01) | |
| *B65G 19/28* | (2006.01) | |
| *B65G 19/02* | (2006.01) | |
| *H01L 21/677* | (2006.01) | |
| *H05K 13/02* | (2006.01) | |
| *B65G 21/20* | (2006.01) | |

(52) U.S. Cl.
CPC ............. *B65G 47/14* (2013.01); *B65G 19/02* (2013.01); *B65G 19/282* (2013.01); *B65G 21/2036* (2013.01); *B65G 47/24* (2013.01); *H01L 21/67718* (2013.01); *H05K 13/022* (2013.01); *B65G 2811/0626* (2013.01)

(58) Field of Classification Search
CPC .... B65G 19/02; B65G 19/225; B65G 19/282; B65G 19/303; B65G 47/14; B65G 47/1492; B65G 47/24; B65G 47/244; B65G 2811/0626; B65G 21/2036; H05K 13/022; H01L 21/67718
USPC ................................. 198/389, 390, 400, 416
See application file for complete search history.

(56) References Cited

U.S. PATENT DOCUMENTS

| | | | | |
|---|---|---|---|---|
| 6,527,101 B1 * | 3/2003 | Miyamoto | ......... | B65G 47/1457 |
| | | | | 198/397.04 |
| 7,017,731 B2 * | 3/2006 | Ikeda | ................... | H05K 13/028 |
| | | | | 198/464.2 |

(Continued)

FOREIGN PATENT DOCUMENTS

| | | |
|---|---|---|
| JP | 2004-315227 A | 11/2004 |
| JP | 2005-015149 A | 1/2005 |
| JP | 2013-053936 A | 3/2013 |

OTHER PUBLICATIONS

International Search Report issued in PCT/JP2015/065692; dated Aug. 18, 2015.

(Continued)

*Primary Examiner* — Gene O Crawford
*Assistant Examiner* — Keith R Campbell
(74) *Attorney, Agent, or Firm* — Studebaker & Brackett PC

(57) ABSTRACT

A conveyance apparatus which can suppress the occurrence of a defect on a work caused due to the entrance of a corner portion of the work into a hole portion formed on a conveyance surface of a base.

7 Claims, 8 Drawing Sheets

(56) References Cited

U.S. PATENT DOCUMENTS

| | | | |
|---|---|---|---|
| 7,592,823 B2* | 9/2009 | Garcia | B07C 5/344 |
| | | | 324/754.13 |
| 8,710,387 B2 | 4/2014 | Wang et al. | |
| 9,630,783 B2* | 4/2017 | Harada | B65G 47/1485 |
| 9,728,433 B2* | 8/2017 | Harada | H01L 21/67721 |
| 2016/0376112 A1* | 12/2016 | Harada | B65G 47/248 |
| | | | 414/781 |

OTHER PUBLICATIONS

Written Opinion issued in PCT/JP2015/065692; dated Aug. 18, 2015.
International Preliminary Report on Patentability issued in PCT/JP2015/065692; dated Dec. 6, 2016.

* cited by examiner

CONVEYANCE APPARATUS

CROSS REFERENCE TO RELATED APPLICATIONS

This application claims benefit of priority to Japanese Patent Application 2014-115490 filed Jun. 4, 2014, and to International Patent Application No. PCT/JP2015/065692 filed May 29, 2015, the entire content of which is incorporated herein by reference.

TECHNICAL FIELD

The present disclosure relates to a conveyance apparatus, and more particularly to a conveyance apparatus where a conveyance member moves relative to a base.

BACKGROUND

A conveyance apparatus where a conveyance member moves relative to a base has been used in a step of measuring characteristics of electronic parts, a step of packaging electronic parts or the like.

For example, FIG. 9 is an explanatory view of a conveyance apparatus which is used for measuring characteristics of a multilayer ceramic capacitor. As shown in FIG. 9, a work W is stored in a storing portion 104 which is a through hole formed in a conveyance member 102. The conveyance member 102 is disposed on a base 101, rotates with respect to the base 101, and moves in a direction indicated by an arrow A. Along with this movement of the conveyance member 102, the work W is conveyed while being in contact with an upper surface (conveyance surface) of the base 101.

As a measuring part 106, a lower-side probe 161 is disposed at a predetermined position of the base 101, and the lower-side probe 161 is exposed to the conveyance surface. Above the conveyance member 102, an upper-side probe 160 having a roller shape is disposed at a position where the lower-side probe 161 opposedly faces the upper-side probe 160. When the work W passes between the upper-side probe 160 and the lower-side probe 161, outer electrodes Wa, Wb of the work W are brought into contact with the probes 160, 161 so that electric characteristics of the work W are measured by means of the probes 160, 161 (see Japanese Patent Application Laid-Open No. 2013-53936, for example).

SUMMARY

Problem to be Solved by the Disclosure

For example, for performing sucking of a work, advancing or retracting a probe or the like, a hole portion is formed on a conveyance surface of a base in a direction that the hole portion is indented from the conveyance surface.

FIG. 7(a) to FIG. 7(c) are explanatory views showing a work 2 and a hole portion 12. FIG. 7(a) is a plan view of a conveyance surface 10s of a base as viewed from a positive side to a negative side in a Z direction among an X direction, a Y direction and the Z direction which are orthogonal to each other. The conveyance direction of the work 2 is the X direction. FIG. 7(b) and FIG. 7(c) are cross-sectional views of the work 2 and the base 10 taken along a line F-F in FIG. 7(a), and are also cross-sectional views of the work 2 and the base 10 as viewed in a direction from an upstream side to a downstream side in a conveyance direction of the work 2.

As shown in FIG. 7(a), in the case where a width of the work 2 having a rectangular parallelepiped shape is smaller than a size of an opening of a hole portion 12 formed on a conveyance surface 10s of the base, when the work 2 straddles over the hole portion 12 as shown in FIG. 7(b), the work 2 is conveyed without any problem in the X direction. However, when a corner portion 2k of the work 2 enters the hole portion 12 as shown in FIG. 7(c), unless the corner portion 2k of the work 2 smoothly moves out from the hole portion 12 along with the conveyance of the work 2 in the X direction, the work 2 bites into the hole portion 12 thus causing a defect such as flaws and chipping on the work 2.

FIG. 8(a) and FIG. 8(b) are explanatory views showing the work 2 and the hole portion 12x. FIG. 8(a) is a plan view of the conveyance surface 10s of the base. FIG. 8(b) is an enlarged perspective view of a main part showing the conveyance surface 10s of the base. The conveyance direction of the work 2 is the X direction.

As shown in FIG. 8(a), by making a size of the opening of the hole portion 12x formed in the conveyance surface 10s of the base smaller than a width of the work 2, a probability of occurrence of the above-mentioned defect on the work 2 becomes small. For example, as shown in FIG. 8(b), even when the corner portion 2k of the work 2 enters the hole portion 12x, sides 2p, 2q, 2r of the work 2 are brought into contact with an outer edge 12w of the hole portion 12x and hence, there may be a case that the corner portion 2k of the work 2 smoothly moves out from the hole portion 12x along with the conveyance of the work 2. However, when an inclination angle of the work 2 is large, the work 2 bites into the hole portion 12x so that a defect such as a flaw and chipping still occurs on the work 2.

Further, there may be also the case where it is difficult to make a size of an opening of the hole portion 12x formed in the conveyance surface 10s of the base smaller than a width of the work 2. For example, in the case where a size of the hole portion 12x is made smaller in response to downsizing of the work 2, processing of the hole portion 12x becomes difficult or a desired suction force cannot be acquired even when a suction is made through the hole portion 12x.

The present disclosure has been made under such circumstances, and it is an object of the present disclosure to provide a conveyance apparatus which can suppress the occurrence of a defect on a work caused due to the entrance of a corner portion of the work into a hole portion formed on a conveyance surface of a base.

Means for Solving the Problem

To solve the above-mentioned problems, the present disclosure provides a conveyance apparatus having the following configuration.

The conveyance apparatus is of a type which includes: a conveyance member having a storing portion capable of storing a work; and a base having a conveyance surface with which the work stored in the storing portion is brought into contact, wherein the work stored in the storing portion is conveyed to a downstream side in a conveyance direction with the work held in contact with the conveyance surface due to movement of the conveyance member relative to the base. The base has: a hole portion formed in the base in a direction that the hole portion is indented from the conveyance surface so as to allow a corner portion of the work to enter the hole portion; and an escape portion formed in the base in a direction that the escape portion is indented from the conveyance surface so as to allow the corner portion of the work to enter the escape portion, is connected to a downstream side of the hole portion in the conveyance direction, and extends toward the downstream side in the conveyance direction. A connecting portion where the hole portion and the escape portion are connected to each other is formed so as to prevent the connecting portion from interfering with the work whose corner portion is entering the hole portion when the work passes the connecting portion. The escape portion includes at least one of: (a) a first move-out region where a depth of a bottom surface which opposedly faces the corner portion of the work entering the escape portion from the conveyance surface is gradually decreased in a direction toward the downstream side in the conveyance direction; (b) a second move-out region where a width of a portion of the second move-out region which sandwiches the work whose corner portion is entering the escape portion by being brought into contact with the work from both sides in a direction which intersects with the conveyance direction of the work is gradually decreased in the direction toward the downstream side in the conveyance direction; and (c) a third move-out region where a depth of a bottom surface which opposedly faces the corner portion of the work entering the escape portion from the conveyance surface is gradually decreased in a direction toward the downstream side in the conveyance direction, and where a width of a portion of the third move-out region which sandwiches the work whose corner portion is entering the escape portion by being brought into contact with the work from both sides in a direction which intersects with the conveyance direction of the work is gradually decreased in the direction toward the downstream side in the conveyance direction.

With the above-mentioned configuration, even when the corner portion of the work enters the hole portion, the corner portion of the work enters the escape portion and the corner portion moves out from the escape portion by passing at least one of the first to third move-out regions. Accordingly, it is possible to prevent the work from biting into the hole portion. As a result, it is possible to suppress the occurrence of a defect on a work caused due to the entrance of the corner portion of the work into the hole portion.

It is preferable that at least one of the first to third move-out regions of the escape portion include a portion extending in a direction away from a normal conveyance direction along which the work is conveyed to the downstream side in the conveyance direction while passing above the hole portion in a state where the corner portion of the work is prevented from entering the hole portion.

In this case, by moving the corner portion of the work entering the hole portion along the portion extending in the direction away from the normal conveyance direction, it is possible to control a posture of the work after the work passes the escape portion by inclining the work in a desired direction.

It is preferable that the hole portion be connected to a vacuum source.

In this case, the corner portion of the work easily enters the hole portion and it is difficult for the corner portion of the work to move out from the hole portion once the corner portion of the work enters the hole portion. Accordingly, an advantageous effect brought about by the present disclosure becomes particularly outstanding.

Advantageous Effect of the Disclosure

According to the present disclosure, it is possible to suppress the occurrence of a defect on a work caused due to the entrance of the corner portion of the work into the hole portion formed on the conveyance surface of the base.

BRIEF DESCRIPTION OF THE DRAWINGS

FIG. 4(a) and FIG. 4(b) are views showing a state where a corner portion of a work enters a hole portion, wherein FIG. 4(a) is a plan view, and FIG. 4(b) is a cross-sectional view. (Embodiment 1)

FIG. 7(a) and FIG. 7(b) are explanatory views showing a work and a hole portion, wherein FIG. 7(a) is a plan view, FIG. 7(b) is a cross-sectional view, and FIG. 7(c) is a cross-sectional view. (Explanatory example 1)

FIG. 8(a) and FIG. 8(b) are explanatory views showing a work and a hole portion, wherein FIG. 8(a) is a plan view, and FIG. 8(b) is an enlarged perspective view showing a main part. (Explanatory example 2)

DETAILED DESCRIPTION

Mode for Carrying Out the Disclosure

Hereinafter, embodiments of the present disclosure are described with reference to FIG. 1(a) to FIG. 6(d).

Embodiment 1

A conveyance apparatus of an embodiment 1 is described with reference to FIG. 1(a) to FIG. 4(b).

Figure 1A:
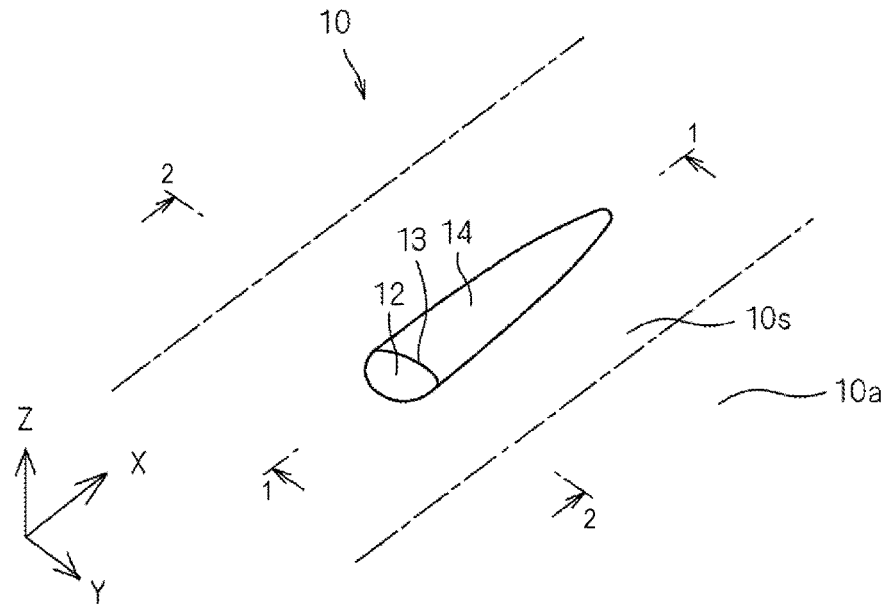
FIG. 1(a) is a perspective view of a base.
Figure 1B:
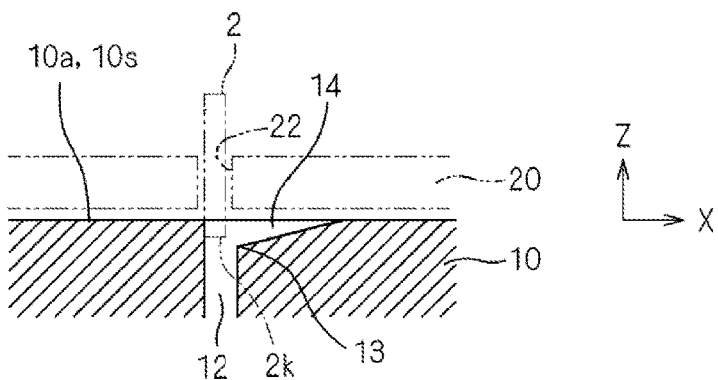
FIG. 1(b) and FIG. 1(c) are cross-sectional views of the base. (Embodiment 1)
Figure 1C:
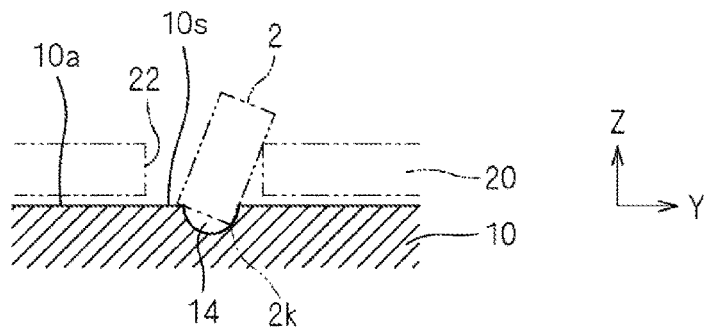
Figure 2:
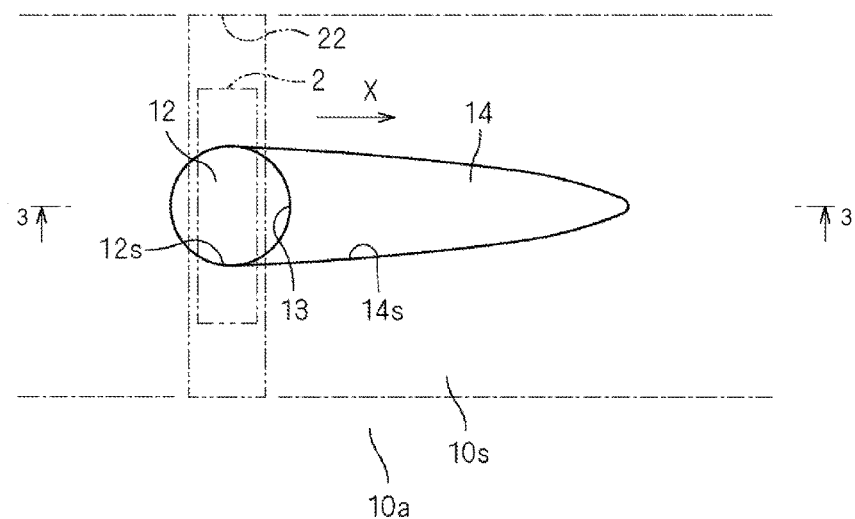
FIG. 2(a) is a plan view of the base.
FIG. 2(b) is a cross-sectional view of the base. (Embodiment 1)
Figure 2:
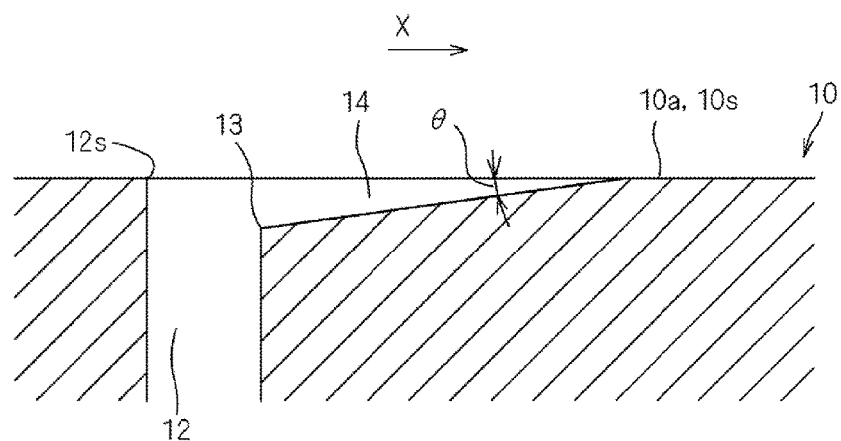

FIG. 1(a) is a perspective view of a base 10 of the conveyance apparatus. FIG. 1(b) is a cross-sectional view taken along a line 1-1 in FIG. 1(a). FIG. 1(c) is a cross-sectional view taken along a line 2-2 in FIG. 1(a). FIG. 2 (a) is a plan view of the base 10. FIG. 2(b) is a cross-sectional view taken along a line 3-3 in FIG. 2(a).

As shown in FIG. 1(b) and FIG. 1(c), an upper surface 10a of the base 10 has a plane which extends in X-Y directions and is perpendicular to a Z axis. A conveyance member 20 indicated by a chain line is disposed on the base 10. As shown in the drawings, the conveyance member 20 is disposed such that a gap is formed between the conveyance member 20 and the upper surface 10a of the base 10. The conveyance member 20 may be disposed so as to be in contact with the upper surface 10a of the base 10.

A storing portion 22 which can store a work 2 therein is formed in the conveyance member 20. For example, as the storing portion 22, a through hole is formed in the conveyance member 20 having a plate shape. The conveyance member 20 may have a shape other than a plate shape. The storing portion formed in the conveyance member may be a non-through hole or a recessed portion which is formed by notching an outer periphery of the conveyance member.

The work 2 has a rectangular parallelepiped shape, a columnar shape or the like. The work 2 is an electronic component which is a finished product having sizes of approximately several mm, for example.

The conveyance member 20 moves relative to the base 10 toward a positive side in the X direction in FIG. 1(a) and FIG. 1(b). The work 2 stored in the storing portion 22 is conveyed toward a downstream side in the conveyance direction (a positive side in the X direction) while being in contact with the upper surface 10a of the base 10. For example, the conveyance member 20 may be rotated relative to the base 10, or may be moved in a predetermined path having a linear shape or a curved shape. The conveyance apparatus may be configured such that the conveyance member 20 is held stationary while the base 10 is moved, or may be configured such that both the conveyance member 20 and the base 10 are moved. For example, the conveyance member 20 is rotated relative to the base 10, and the storing portion 22 is moved at a speed of approximately 0.0001 to 0.0150 m/s.

With respect to the upper surface 10a of the base 10, a portion of the upper surface 10a on which the work 2 moves while being in contact with the portion forms a conveyance surface 10s. The conveyance surface 10s is coplanar with portions of the upper surface 10a of the base 10 other than the conveyance surface 10s. However, the conveyance surface 10s is not necessarily coplanar with the portions of the upper surface 10a of the base 10 other than the conveyance surface 10s. The conveyance surface 10s may project in a rail shape, or may be indented in a groove shape. Alternatively, the conveyance surface 10s may have a flat surface or a curved surface. The work 2 may be pressed to a base 10 side from above the conveyance member 20.

The conveyance member 20 and at least the conveyance surface 10s of the upper surface 10a of the base 10 are made of metal or a resin.

As shown in FIG. 1(a) to FIG. 2(b), a hole portion 12 and an escape portion 14 are formed on the base 10. The hole portion 12 and the escape portion 14 are formed in a direction that the hole portion 12 and the escape portion 14 are indented from the conveyance surface 10s of the base 10 (toward a negative side in the Z direction). As shown in FIG. 1(b) and FIG. 1(c), the hole portion 12 and the escape portion 14 are formed so as to allow the entrance of the corner portion 2k of the work 2 into the hole portion 12 and the escape portion 14.

The hole portion 12 is, for example, a flow passage for air for sucking the work 2 by vacuum. In the case where the hole portion 12 forms a passage for air or the like, the hole portion 12 is formed in the base 10 in a penetrating manner. However, when the hole portion 12 is not required to have a function of a passage, the hole portion 12 may not be formed in the base 10 in a penetrating manner. The hole portion 12 may be a flow passage for blowing off compressed air to the conveyance surface 10s, a space for housing a measurement probe or an ejection pin which projects from a conveyance surface 10s side or retracts to the conveyance surface 10s side, a space for storing a camera, a sensor or the like for observing the conveyance surface 10s side, or a threaded hole. The hole portion 12 may have a circular shape, an elliptical shape or a rectangular shape.

The work 2 stored in the storing portion 22 of the conveyance member 20 usually passes over the hole portion 12 and the escape portion 14 in a state where the work 2 is in contact with the conveyance surface 10s of the base 10.

However, there may be a case where, due to any cause such as vibration or adhesion of a foreign material to the work, a posture of the work 2 stored in the storing portion 22 of the conveyance member 20 becomes bad or the position of the work 2 is displaced so that the corner portion 2k of the work 2 enters the hole portion 12. In this case, when the work 2 bites into the hole portion 12 as described above, a defect such as flaws or chipping occurs on the work 2. To avoid the occurrence of such a defect, the escape portion 14 is formed adjacently to the hole portion 12. With the provision of the escape portion 14, even when the corner portion 2k of the work 2 enters the hole portion 12, the corner portion 2k of the work 2 is returned to the conveyance surface 10s. As shown in FIG. 2(b), the escape portion 14 has an inclination angle θ. It is preferable that the inclination angle θ satisfy the relationship of 0°<θ<60°, and more preferably the relationship of 0.1°≤θ≤45°.

Next, the escape portion 14 is described with reference to FIG. 4(a) and FIG. 4(b). FIG. 4(a) is a plan view showing a state where the corner portion 2k of the work 2 enters the hole portion 12. FIG. 4(b) is a cross-sectional view taken along a line 4-4 in FIG. 4(a).

As shown in FIG. 4(a) and FIG. 4(b), assume a length of the work 2 having a rectangular parallelepiped shape as "L", a width of the work 2 as "W", and a thickness of the work 2 as "T". Assume that the relationship T<L and the relationship T<W are established. Further assume an inner diameter of the hole portion 12 having a circular cylindrical shape as "D".

As shown in FIG. 4(a), assuming a width of a portion of the work 2 which enters the hole portion 12 when the corner portion 2k of the work 2 enters the hole portion 12 as "P", an equation $(D/2)^2=(P/2)^2+(T/2)^2$ is established so that P becomes $D(1-T^2/D^2)^{1/2}$ ($P=D(1-T^2/D^2)^{1/2}$).

The corner portion 2k of the work 2 has a right angle and hence, the corner portion 2k of the work 2 is positioned on a semicircle 13x indicated by a chain line in FIG. 4(b) corresponding to an inclination of the work 2. The semicircle 13x has a diameter "P" so that, assuming a maximum depth of the corner portion 2k of the work 2 from the conveyance surface 10s as "Q", Q is P/2 (Q=P/2) so that an equation $Q=D(1-T^2/D^2)^{1/2}/2$ is established.

A depth of the connecting portion 13 shown in FIG. 4(a) where the hole portion 12 and the escape portion 14 are connected to each other is set equal to or larger than a depth of the semicircle 13x shown in FIG. 4(b). By setting the depth of the connecting portion 13 in this manner, when the work 2 whose corner portion 2k is entering the hole portion 12 is conveyed in the X direction in FIG. 4(a), the work 2 can pass over the connecting portion 13 without interfering with the connecting portion 13. That is, the depth of the connecting portion 13 is set equal to or larger than a maximum depth Q of the corner portion 2k from the conveyance surface 10s which the corner portion 2k of the work 2 takes when the corner portion 2k of the work 2 enters the hole portion 12.

The escape portion 14 is formed such that the corner portion 2k of the work 2 which enters the escape portion 14 from the hole portion 12 can move out from the escape portion 14 along with the conveyance of the work 2.

For example, the escape portion 14 is formed such that a bottom surface of the escape portion 14 has an inclined surface as shown in FIG. 1(b) and FIG. 2(b) so that the corner portion 2k of the work 2 entering the escape portion 14 is brought into contact with the inclined surface, is lifted up along with the conveyance of the work 2 and, eventually, moves out from the escape portion 14. In this case, the escape portion 14 forms a first move-out region where a depth of a bottom surface (a bottom surface of the escape portion 14) which opposedly faces the corner portion 2k of the work 2 entering the escape portion 14 from the conveyance surface 10s is gradually decreased in the direction toward the downstream side in the conveyance direction (a positive side in the X direction). It is preferable that the depth of the escape portion 14 be gradually decreased and become zero at the end of the escape portion 14. The corner portion 2k of the work 2 entering the escape portion 14 moves out from the escape portion 14 through the first move-out region.

As an alternative structure, as shown in FIG. 2(a), the escape portion 14 may be formed such that a width of the escape portion 14 is gradually narrowed in the direction toward a downstream side in the work conveyance direction so that the work 2 is lifted up while being conveyed in a state where the work 2 is sandwiched by the escape portion 14 and, eventually, the work 2 moves out from the escape portion 14. In this case, the escape portion 14 forms a second move-out region where a width of a portion (a portion of the escape portion 14) which sandwiches the work 2 whose corner portion 2k is entering the escape portion 14 by being brought into contact with the work 2 from both sides in the direction (Y direction) which intersects with the conveyance direction (X direction) of the work 2 is gradually decreased in the direction toward the downstream side in the conveyance direction (a positive side in the X direction). It is preferable that the width of the escape portion 14 be gradually decreased and become zero at the end of the escape portion 14. The corner portion 2k of the work 2 which enters the escape portion 14 moves out from the escape portion 14 through the second move-out region.

As another alternative structure, as shown in FIG. 2(a) and FIG. 2(b), both the bottom surface and the width of the escape portion 14 may be formed as described above. In this case, the escape portion 14 forms a third move-out region where a depth of a bottom surface (a bottom surface of the escape portion 14) which opposedly faces the corner portion 2k of the work 2 entering the escape portion 14 from the conveyance surface 10s is gradually decreased in the direction toward the downstream side in the conveyance direction (a positive side in the X direction) and a width of a portion (a portion of the escape portion 14) which sandwiches the work 2 whose corner portion 2k is entering the escape portion 14 by being brought into contact with the work 2 from both sides in the direction (Y direction) which intersects with the conveyance direction of the work 2 is gradually decreased in the direction toward the downstream side in the conveyance direction (a positive side in the X direction). It is preferable that the depth and the width of the escape portion 14 be gradually decreased and become zero at the end of the escape portion 14. The corner portion 2k of the work 2 which enters the escape portion 14 moves out from the escape portion 14 through the third move-out region.

Although not shown in the drawing, the escape portion 14 may be formed such that the first move-out region and second move-out region are sequentially disposed. For example, the second move-out region may be formed succeeding the first move-out region, or the first move-out region may be formed succeeding the second move-out region.

That is, the escape portion 14 has at least one of the first to third move-out regions, and the corner portion 2k of the work 2 entering the escape portion 14 moves out from the escape portion 14 through at least one of the first to third move-out regions.

Figure 3:
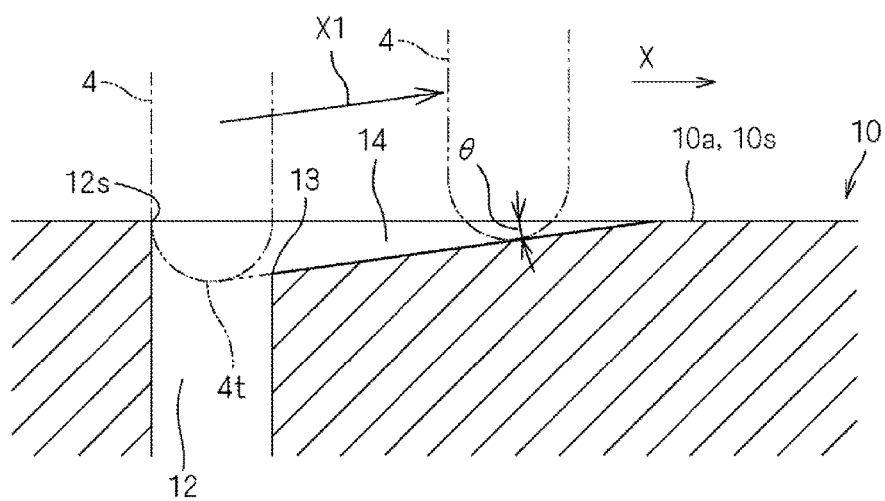
FIG. 3 is an explanatory view for describing a method for processing an escape portion. (Embodiment 1)

FIG. 3 is an explanatory view for describing a method for processing the escape portion 14. As shown in FIG. 3, the escape portion 14 can be formed using a drill 4 having a semicircular shape on a distal end 4t side. To be more specific, a distal end 4t of the drill 4 is inserted into the hole portion 12 and, in a state where a center axis of rotation of the drill 4 is maintained perpendicular to the upper surface 10a of the base 10, the drill 4 cuts the base 10 while being linearly moved in the oblique direction with respect to the upper surface 10a of the base 10 as indicated by an arrow X1. In this case, it is preferable that an inclination angle θ of the escape portion 14 (that is, an angle made by a direction along which the drill 4 is linearly moved in the oblique direction with respect to the upper surface 10a of the base 10 and the upper surface 10a of the base 10) fall within a range of $0°<\theta<60°$, and more preferably within a range of $0.1°\leq\theta\leq45°$. The escape portion 14 may also be formed using a method other than the above-mentioned method.

Figure 4:
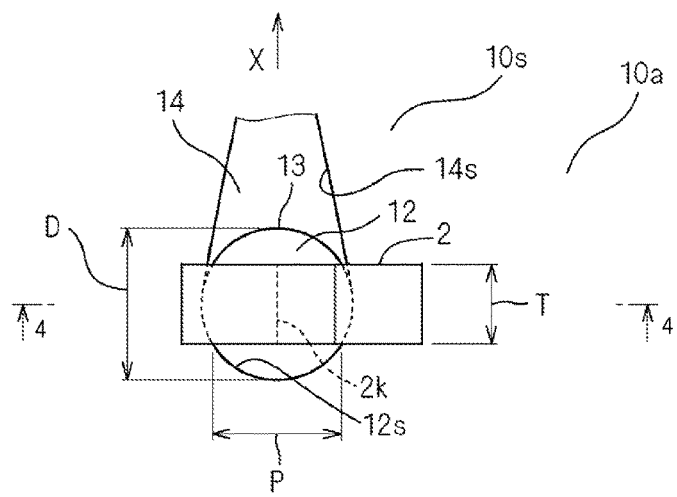
Figure 4:
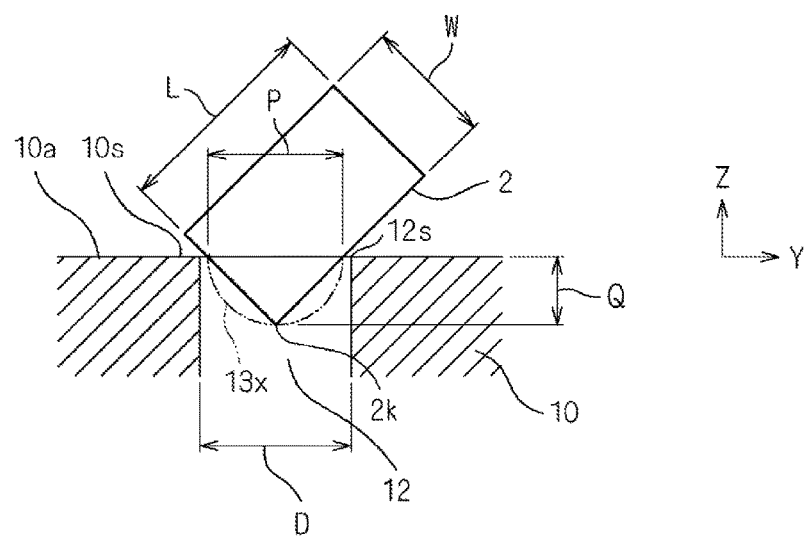

An outer edge 12s of the hole portion 12 and an outer edge 14s of the escape portion 14 shown in FIG. 2 to FIG. 4 may be or may not be chamfered. A depth that the corner portion 2k of the work 2 is inserted into the hole portion 12 and the escape portion 14 changes depending on a shape or a size of a chamfered portion. By not chamfering the outer edge 12s of the hole portion 12 and the outer edge 14s of the escape portion 14, a depth of the escape portion 14 can be made shallowest. On the other hand, by chamfering the outer edge 12s of the hole portion 12 and the outer edge 14s of the escape portion 14, flaws which may occur on the work 2 by the outer edge 12s of the hole portion and the outer edge 14s of the escape portion 14 can be suppressed.

Next, the manner of operation and the advantageous effects of the conveyance apparatus of embodiment 1 are described. The conveyance member 20 moves relative to the base 10. The work 2 is stored in the storing portion 22 of the conveyance member 20 on an upstream side of the hole portion 12 and the escape portion 14 in the conveyance direction. The work 2 stored in the storing portion 22 passes the hole portion 12 and the escape portion 14 along with the movement of the conveyance member 20. When the corner portion 2k of the work 2 enters the hole portion 12, along with the conveyance of the work 2, the corner portion 2k of the work 2 and a portion of the work 2 in the vicinity of the corner portion 2k pass the connecting portion 13 between the hole portion 12 and the escape portion 14 without interfering with the connecting portion 13 and, then, enter the escape portion 14. The corner portion 2k of the work 2 and the portion of the work 2 in the vicinity of the corner portion 2k pass one of the first to third move-out regions of the escape portion 14 and, thereafter, are moved out from the escape portion 14 and are returned to the conveyance surface 10s. Accordingly, it is possible to prevent the work 2 from biting into the hole portion 12. As a result, according to the conveyance apparatus of embodiment 1 of the present disclosure, it is possible to suppress the occurrence of a defect on the work 2 caused due to the entrance of the corner portion 2k of the work 2 into the hole portion 12.

For example, in a conveyance apparatus of a comparison example 1 which has a hole portion 12 but does not have an escape portion 14, cracks or chipping occur on a work 2 at a frequency of one for every 1000 pieces. To the contrary, in the conveyance apparatus of embodiment 1 where the escape portion 14 is formed adjacently to the hole portion 12, cracks or chipping do not occur on the work 2.

Particularly, when the hole portion 12 is connected to a vacuum source so that the work 2 is sucked, the corner portion 2k of the work 2 tends to enter the hole portion 12, and once the corner portion 2k of the work 2 enters the hole portion, it is difficult for the corner portion 2k of the work 2 to move out from the hole portion 12. Accordingly, when the escape portion 14 is not formed on the base 10, a defect tends to occur on the work 2 due to the entrance of the corner portion 2k of the work 2 in the hole portion 12. Accordingly, when the hole portion 12 is connected to a vacuum source, an advantageous effect brought about by the present disclosure becomes particularly outstanding.

Embodiment 2

Figure 5:
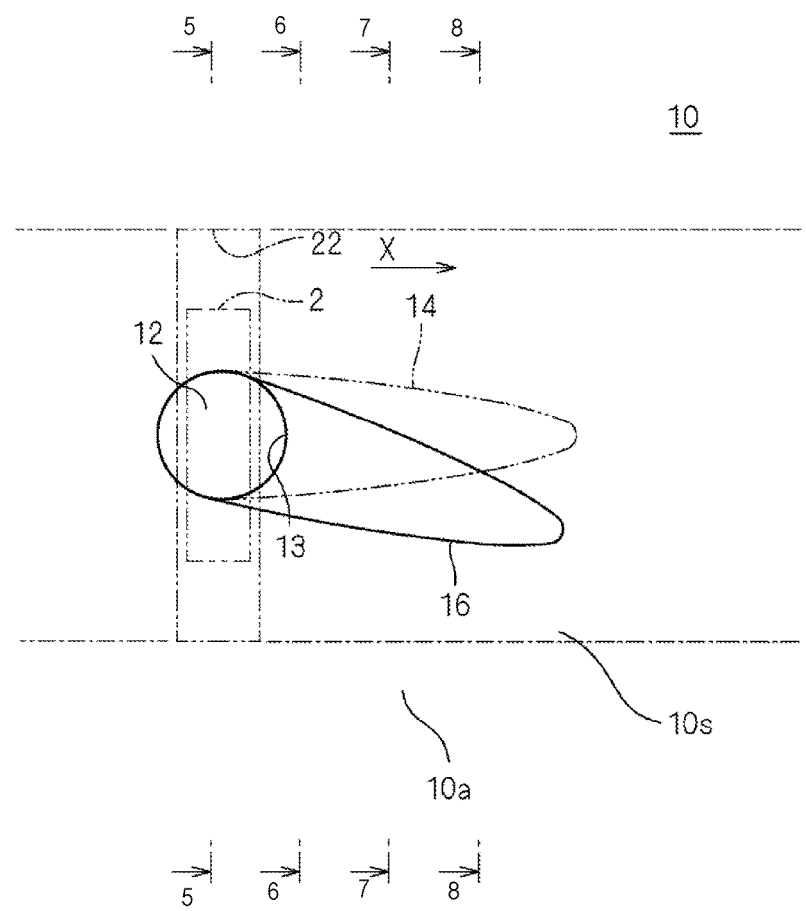
FIG. 5 is a plan view of a base. (Embodiment 2)
Figure 6A:
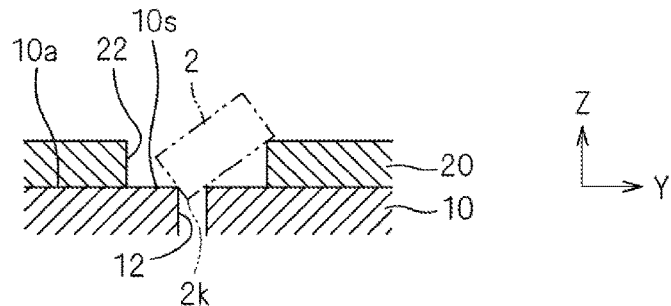
FIG. 6(a) to FIG. 6(d) are cross-sectional views showing a state where a corner portion of a work enters an escape portion. (Embodiment 2)
Figure 6B:
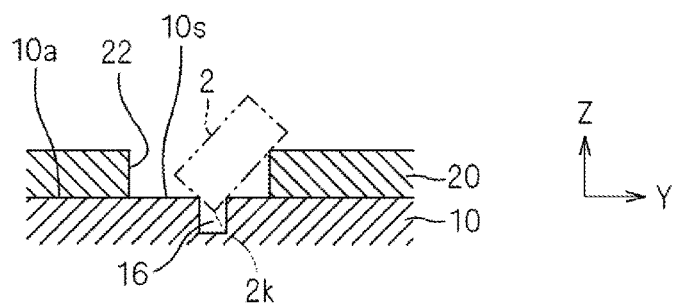
Figure 6C:
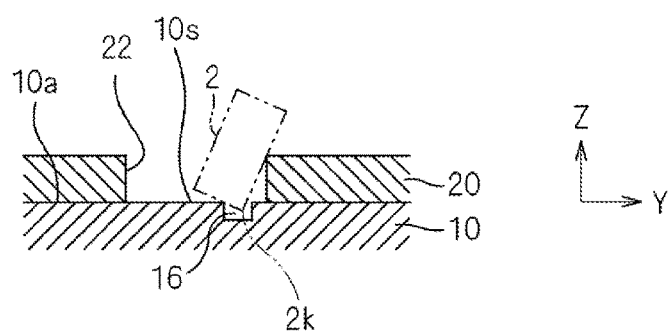
Figure 6D:
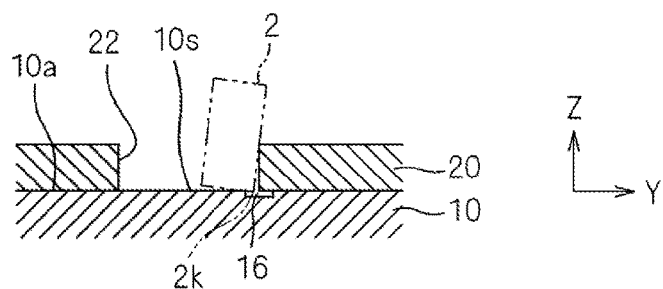
Figure 7:
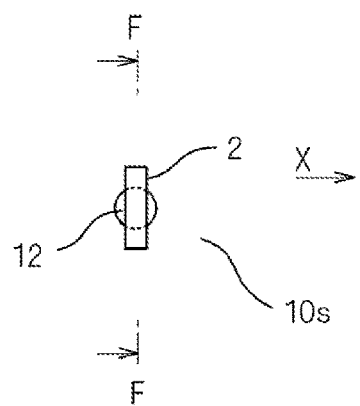
Figure 7:
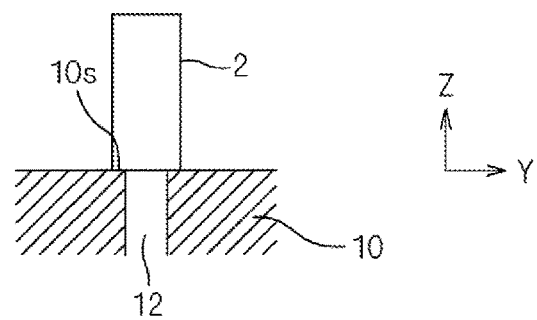
Figure 7:
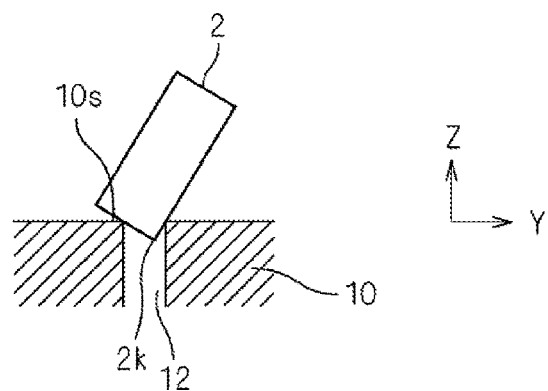
Figure 8:
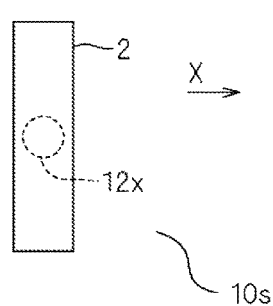
Figure 8:
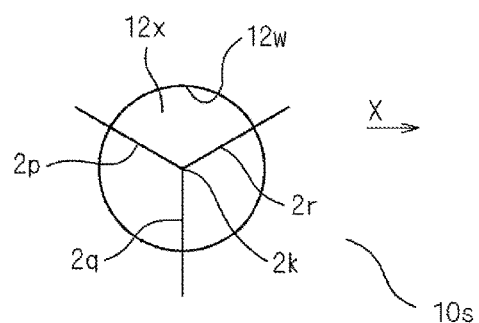
Figure 9:
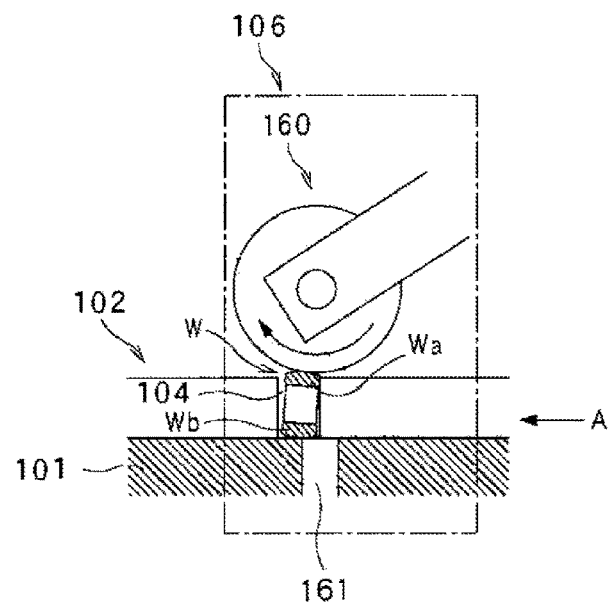
FIG. 9 is an explanatory view of a conveyance apparatus used for measuring characteristics of a multilayer ceramic capacitor. (Conventional example 1)

A conveyance apparatus of an embodiment 2 is described with reference to FIG. 5 and FIG. 6(a) to FIG. 6(d). FIG. 5 is a plan view of a base 10. FIG. 6(a) is a cross-sectional view taken along a line 5-5 in FIG. 5. FIG. 6(b) is a cross-sectional view taken along a line 6-6 in FIG. 5. FIG. 6(c) is a cross-sectional view taken along a line 7-7 in FIG. 5. FIG. 6(d) is a cross-sectional view taken along a line 8-8 in FIG. 5.

The conveyance apparatus of embodiment 2 is configured substantially equal to the conveyance apparatus of embodiment 1. Hereinafter, the description is made by mainly focusing on points which make the conveyance apparatus of embodiment 2 different from the conveyance apparatus of embodiment 1.

As shown in FIG. 5, in the same manner as embodiment 1, a hole portion 12 and an escape portion 16 are formed on the base 10. The hole portion 12 and an escape portion 16 are formed in a direction that the hole portion 12 and the escape portion 16 are indented from a conveyance surface 10s of the base 10 (toward a negative side in the Z direction). The escape portion 14 indicated by a chain line in embodiment 1 extends in a work conveyance direction (X direction). On the other hand, the escape portion 16 in embodiment 2 extends in the oblique direction with respect to the work conveyance direction (X direction). That is, the escape portion 16 in embodiment 2 includes a portion extending in the direction away from the normal conveyance direction along which the work 2 is conveyed to the downstream side in the conveyance direction while passing above the hole portion 12 in a state where a corner portion 2k of the work 2 is prevented from entering the hole portion 12. The escape portion may include, besides the above-mentioned portion extending in the direction away from the normal conveyance direction, a portion extending parallel to the normal conveyance direction, a portion extending in the direction approaching the normal conveyance direction or the like.

As shown in FIG. 5 and FIG. 6(a) to FIG. 6(d), when a downstream side of the escape portion 16 in embodiment 2 is viewed from an upstream side of the escape portion 16 in the conveyance direction of the work 2, the escape portion 16 extends so as to be rightwardly away from the normal conveyance direction of the work 2.

As shown in FIG. 6(a), when a right lower corner portion 2k of the work 2 which is supposed to be stored in the storing portion 22 of the conveyance member 20 in an erected posture enters the hole portion 12, the work 2 is inclined toward the right side. When the work 2 is conveyed, as shown in FIG. 6(b), the right lower corner portion 2k of the work 2 enters the escape portion 16. Then, as shown in FIG. 6(c) and FIG. 6(d), the right lower corner portion 2k of the work 2 moves along the escape portion 16 along with the conveyance of the work 2. As shown in FIGS. 6(a) to 6(d), the right lower corner portion 2k of the work 2 moves to the right side so that the position where the right side of the work 2 is brought into contact with the conveyance member 20 is restricted whereby the inclination of the work 2 toward the right side is gradually decreased along with the conveyance of the work 2. With such a configuration, when the work 2 moves out from the escape portion 16, a posture of the work 2 can be returned to an original erected posture.

On the other hand, assume the case where an escape portion extends so as to be leftwardly away from the work conveyance direction when the downstream side of the escape portion is viewed from an upstream side of the escape portion in the conveyance direction of the work 2. In such a case, when the right lower corner portion 2k of the work 2 enters the escape portion as shown in FIG. 6(a), along with the conveyance of the work, the right lower corner portion 2k moves to the left side along the escape portion so that the work 2 can be further inclined to the right side. With such a configuration, when the work 2 moves out from the escape portion, the work 2 can take a lying posture obtained by laying the work 2 by 90° from an erected posture.

When the escape portion 16 includes a portion extending in the direction away from the normal conveyance direction as in the case of embodiment 2, by moving the corner portion 2k of the work 2 entering the hole portion 12 along the portion of the escape portion 16 extending in the direction away from the normal conveyance direction, it is possible to control a posture of the work 2 after the work 2 passes the escape portion 16 by inclining the work 2 in a desired direction.

CONCLUSION

As has been described heretofore, by forming the escape portion 14, 16 on the downstream side of the hole portion 12 in the conveyance direction, it is possible to suppress the occurrence of defects on the work 2 caused due to the entrance of the corner portion 2k of the work 2 into the hole portion 12.

The present disclosure is not limited to the above-mentioned embodiments, and can be carried out with various modifications.

For example, the escape portion may be configured such that a downstream side of the escape portion in the conveyance direction is branched so that the escape portion include a plurality of move-out regions selected from the first to third move-out regions.

INDUSTRIAL APPLICABILITY

The conveyance apparatus according to the present disclosure is applicable to a characteristic sorting apparatus which sorts electronic parts by measuring characteristics of the electronic parts, an external appearance sorting apparatus which sorts electronic parts into non-defective products and defective products by inspecting an external appearance of the electronic parts, a mounting machine for mounting electronic parts, a parts feeder or the like. The conveyance apparatus according to the present disclosure is also applicable for conveying parts other than electronic parts.

The invention claimed is:

1. A conveyance apparatus comprising:
    a conveyance member having a storing portion including at least one surface defining a space and the space being configured to store a work; and
    a base having a conveyance surface with which the work stored in the storing portion is brought into contact, wherein the work stored in the storing portion is conveyed to a downstream side in a conveyance direction with the work held in contact with the conveyance surface due to movement of the conveyance member relative to the base, wherein the base has:

a hole portion formed in the base in a direction that the hole portion is indented from the conveyance surface and configured to allow only two or less corner portions of the work to enter the hole portion; and an escape portion formed in the base in a direction that the escape portion is indented from the conveyance surface and configured to allow the only two or less corner portions of the work to enter the escape portion, the escape portion being connected to a downstream side of the hole portion in the conveyance direction, and the escape portion extending toward the downstream side in the conveyance direction, a connecting portion where the hole portion and the escape portion are connected to each other is formed so as to prevent the connecting portion from interfering with the work when at least one of the only two or less corner portions is entering the hole portion and the work passes the connecting portion, and the escape portion includes at least one of:

a first move-out region where a depth of a bottom surface which is configured to oppositely face the at least one of the only two or less corner portions of the work when the at least one of the only two or less corner portions is entering the escape portion from the conveyance surface is gradually decreased in a direction toward the downstream side in the conveyance direction;

a second move-out region where a width of a portion of the second move-out region which is configured to sandwich the work when the at least one of the only two or less corner portions is entering the escape portion by being brought into contact with the work from both sides in a direction which intersects with the conveyance direction of the work is gradually decreased in the direction toward the downstream side in the conveyance direction; and a third move-out region where a depth of a bottom surface which is configured to oppositely face the at least one of the only two or less corner portions of the work when the at least one of the only two or less corner portions is entering the escape portion from the conveyance surface is gradually decreased in a direction toward the downstream side in the conveyance direction and a width of a portion of the third move-out region which is configured to sandwich the work when the at least one of the only two or less corner portions is entering the escape portion by being brought into contact with the work from both sides in a direction which intersects with the conveyance direction of the work is gradually decreased in the direction toward the downstream side in the conveyance direction.

2. The conveyance apparatus according to claim 1, wherein said at least one of the first to third move-out regions of the escape portion includes a portion extending, in a plan view in a direction orthogonal to the conveyance surface, in a direction away from the conveyance direction.

3. The conveyance apparatus according to claim 1, wherein the hole portion is connected to a vacuum source.

4. The conveyance apparatus according to claim 2, wherein the hole portion is connected to a vacuum source.

5. The conveyance apparatus according to claim 1, wherein the hole portion has a cylindrical shape; and the connecting portion has a depth equal to or greater than a maximum depth Q of the at least one of the only two or less corner portions, which satisfies the following equation:

$$Q=D(1-T^2/D^2)^{1/2}/2,$$

where D is an inner diameter of the hole portion, and T is a thickness of the work.

6. A conveyance apparatus comprising:

a conveyance member having a storing portion including at least one surface defining a space and the space being configured to store a work; and a base having a conveyance surface with which the work stored in the storing portion is brought into contact, wherein the work stored in the storing portion is conveyed to a downstream side in a conveyance direction with the work held in contact with the conveyance surface due to movement of the conveyance member relative to the base, wherein the base has:

a hole portion formed in the base in a direction that the hole portion is indented from the conveyance surface so as to allow a corner portion of the work to enter the hole portion; and an escape portion formed in the base in a direction that the escape portion is indented from the conveyance surface so as to allow the corner portion of the work to enter the escape portion, the escape portion being connected to a downstream side of the hole portion in the conveyance direction, and the escape portion extending toward the downstream side in the conveyance direction, a connecting portion where the hole portion and the escape portion are connected to each other is formed so as to prevent the connecting portion from interfering with the work when the is entering the hole portion and the work passes the connecting portion, and the escape portion includes at least one of:

a first move-out region where a width of a portion of the first move-out region which is configured to sandwich the work when the corner portion is entering the escape portion by being brought into contact with the work from both sides in a direction which intersects with the conveyance direction of the work is gradually decreased in the direction toward the downstream side in the conveyance direction; and a second move-out region where a depth of a bottom surface which is configured to oppositely face the corner portion of the work when the corner portion is entering the escape portion from the conveyance surface is gradually decreased in a direction toward the downstream side in the conveyance direction and a width of a portion of the second move-out region which is configured to sandwich the work when the corner portion is entering the escape portion by being brought into contact with the work from both sides in a direction which intersects with the conveyance direction of the work is gradually decreased in the direction toward the downstream side in the conveyance direction.

7. The conveyance apparatus according to claim 6, wherein the hole portion has a cylindrical shape; and the connecting portion has a depth equal to or greater than a maximum depth Q of the corner portion, which satisfies the following equation:

$$Q=D(1-T^2/D^2)^{1/2}/2,$$

where D is an inner diameter of the hole portion, and T is a thickness of the work.

* * * * *